United States Patent
Huang et al.

(10) Patent No.: US 6,707,167 B2
(45) Date of Patent: Mar. 16, 2004

(54) SEMICONDUCTOR PACKAGE WITH CRACK-PREVENTING MEMBER

(75) Inventors: Chien-Ping Huang, Taichung (TW); Tzong-Da Ho, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 57 days.

(21) Appl. No.: 10/026,594

(22) Filed: Dec. 20, 2001

(65) Prior Publication Data

US 2003/0094676 A1 May 22, 2003

(30) Foreign Application Priority Data

Nov. 21, 2001 (TW) .......................................... 90126794 A

(51) Int. Cl.[7] .............................................. H01L 23/48
(52) U.S. Cl. ........................ 257/790; 257/787; 257/753; 174/52.2
(58) Field of Search ............................... 257/747, 749, 257/790

(56) References Cited

U.S. PATENT DOCUMENTS

| | | | |
|---|---|---|---|
| 5,659,952 A | * 8/1997 | Kovac et al. .................. 29/840 |
| 6,218,215 B1 | * 4/2001 | Distefano et al. ............ 438/108 |
| 6,489,675 B1 | * 12/2002 | Gruber et al. ................ 257/698 |
| 6,518,662 B1 | * 2/2003 | Smith et al. .................. 257/724 |
| 6,602,740 B1 | * 8/2003 | Mitchell ....................... 438/127 |

* cited by examiner

Primary Examiner—Vinh P. Nguyen
Assistant Examiner—Lourdes Cruz
(74) Attorney, Agent, or Firm—Peter F. Corless; Steven M. Jensen; Edwards & Angell, LLP

(57) ABSTRACT

A semiconductor package with a crack-preventing member is proposed, in which a chip is mounted on a chip carrier by means of an adhesive and is electrically connected to the chip carrier. The crack-preventing member is formed at a proper position on the chip, and generates compression stress on the chip to sufficiently counteract tension stress produced from the chip carrier and adhesive in a molding process. This can effectively prevent the chip from cracking during molding, and thus improve the quality of fabricated products.

15 Claims, 9 Drawing Sheets

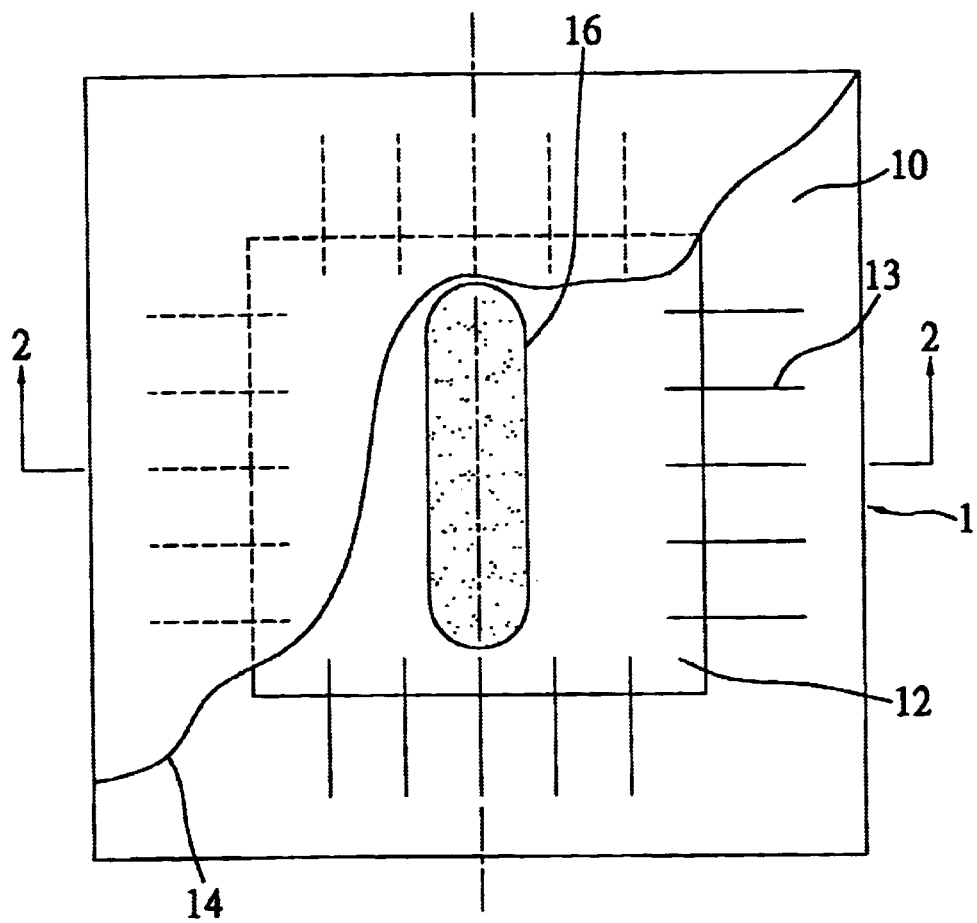
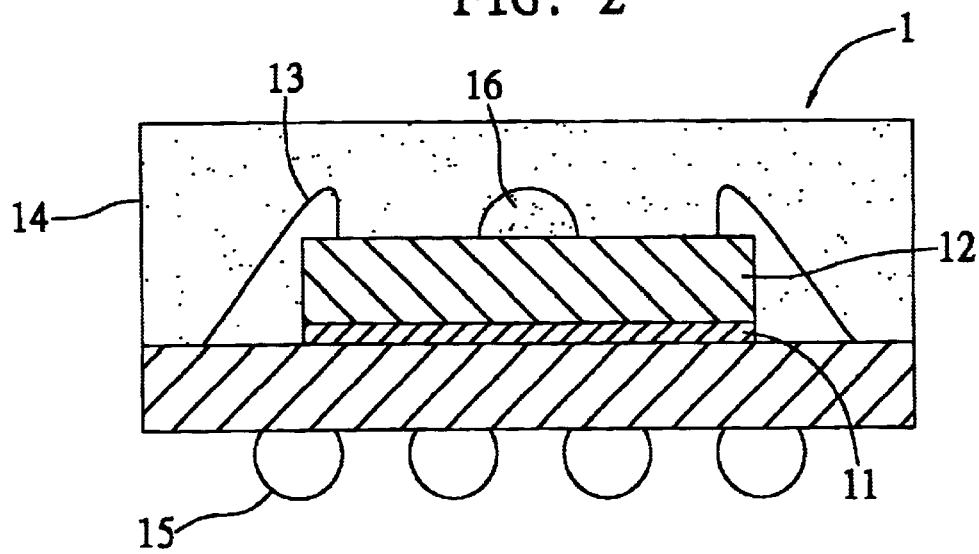

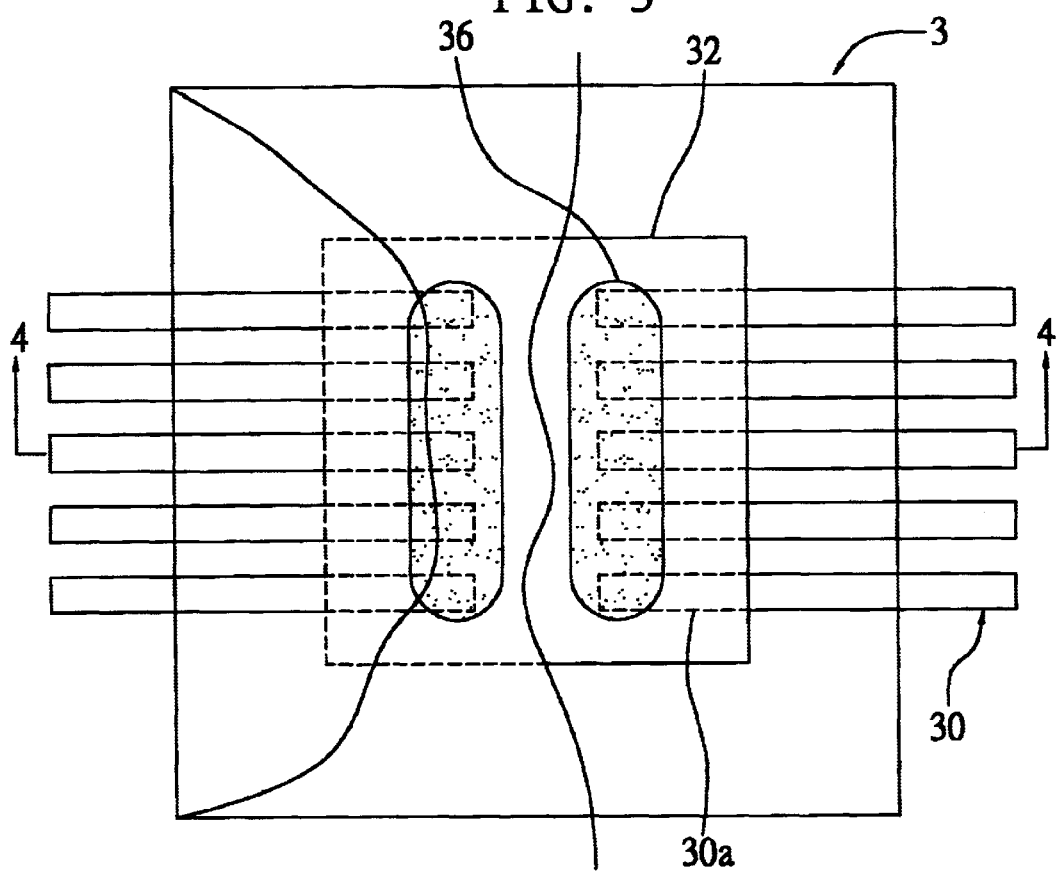
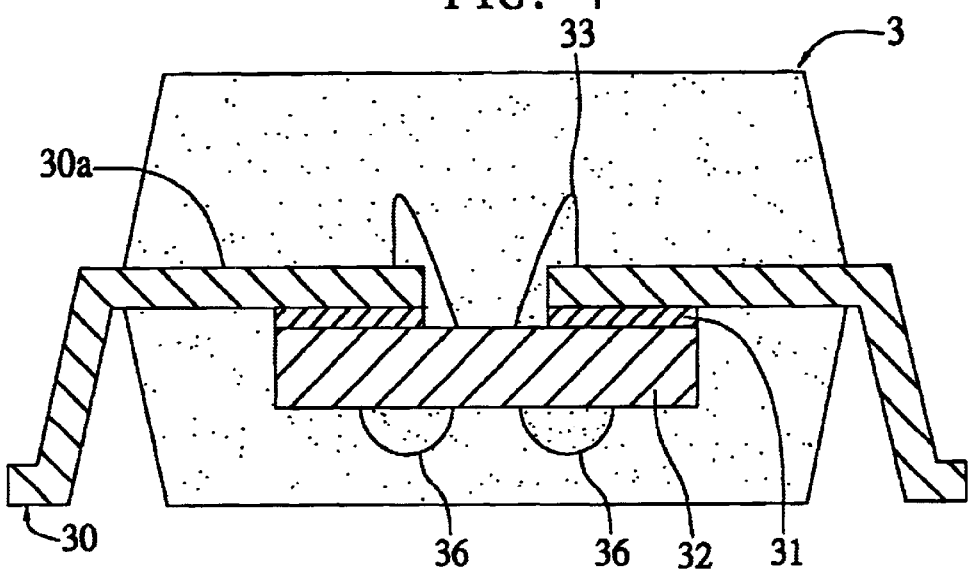

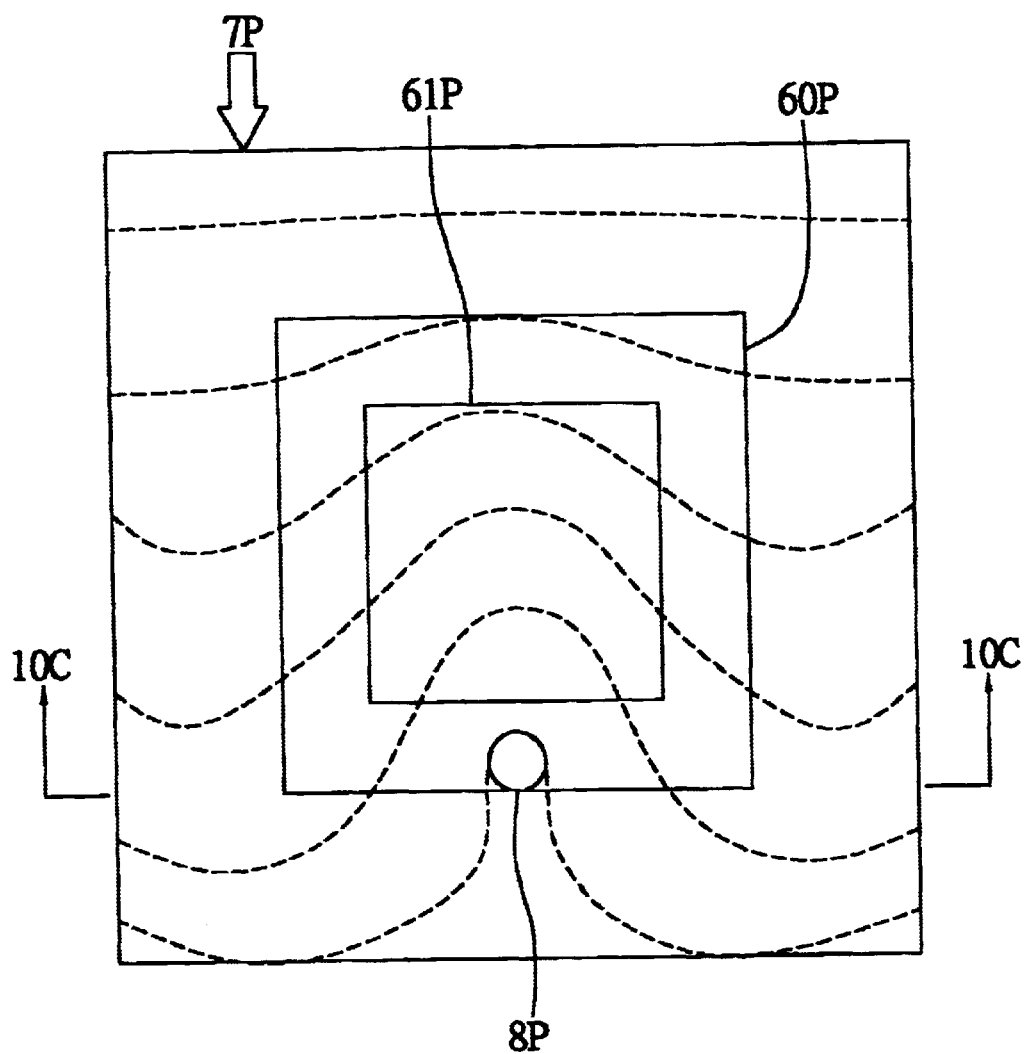

SEMICONDUCTOR PACKAGE WITH CRACK-PREVENTING MEMBER

FIELD OF THE INVENTION

The present invention relates to semiconductor packages, and more particularly, to a thin profile semiconductor package with a chip mounted on a chip carrier.

BACKGROUND OF THE INVENTION

In compliance with profile miniaturization of electronic products, semiconductor packages used as core elements in the electronic products are also preferably reduced in dimensions thereof.

Among thin profile semiconductor packages, LOC (lead-on-chip) semiconductor packages are exemplified herein. As shown in FIG. 8, U.S. Pat. No. 4,862,245 discloses a LOC semiconductor package 5P, in which a chip 50P is directly mounted onto a plurality of leads 51P, so that the leads 51P, in place of a die pad of a common lead frame, are used as a chip carrier for accommodating the chip 50P. However, due to difference in coefficient of thermal expansion (CTE) between the chip 50P and the leads 51P, during a high-temperature molding process or a reliability test such as a thermal shock test, the chip 50P suffers thermal stress from the leads 51P and tends to crack; this therefore damages quality and reliability of the fabricated semiconductor products.

The foregoing problem of chip cracking due to thermal stress, more frequently occurs in even more thin profile semiconductor packages such as TSOP (about 1 mm thick) or VTSOP (about 0.75 mm thick). Since a chip encapsulated in the TSOP or VTSOP semiconductor package often needs to be ground as thin as about 0.15 mm (6 mils), this accordingly reduces mechanical strength of the chip for resisting thermal stress. Therefore, when thermal stress is applied to the chip, it easily cracks the chip during a high-temperature molding process or a reliability test.

In order to solve the foregoing chip cracking problem, U.S. Pat. No. 5,901,043 discloses a semiconductor package with a dummy chip. As shown in FIG. 9, this semiconductor package 6P is characterized of mounting a dummy chip 61P on a chip 60P, wherein the dummy chip 61P is dimensionally smaller and substantially made of the same material as the chip 60P. The combined structure of the chip 60P and the dummy chip 61P can enhance mechanical strength of the chip 60P for resisting thermal stress, thereby reducing the occurrence of chip cracking in fabricating processes.

However, the foregoing semiconductor package 6P incorporated with the dummy chip 61P needs to use an adhesive for adhering the dummy chip 61P onto the chip 60P; this therefore increases complexity and costs in fabrication. Moreover, in a very thin profile TSOP or VTSOP semiconductor package, an encapsulant for encapsulating the chip 60P and the dummy chip 61P is also made thinner than normal. During molding, it may cause an encapsulating resin to flow at a slower speed above the dummy chip 61P than around sides of the dummy chip 61P, as shown in FIG. 10A. Uneven flow speed of the encapsulating resin easily leads to voids 8P formed at an end of the dummy chip 61P corresponding in position to a resin injection gate 7P, as shown in FIGS. 10B and 10C. Void formation may generate popcorn effect or damage to encapsulant appearance, thereby undesirably degrading the quality of fabricated semiconductor products.

Furthermore, during fabrication of a BGA (ball grid array) semiconductor package such as CSP (chip scale package), a chip has a CTE of about only 3 to 4 ppm, and CTEs of a substrate for accommodating the chip and of silver paste for adhering the chip onto the substrate are 18 ppm and 45 ppm, respectively. As shown in FIG. 11A, after the chip 90P is attached to the substrate 92P by means of the silver paste 91P, then in a temperature cycle of a molding process or a subsequent reliability test, as shown in FIG. 11B, the silver paste 91P and the substrate 92P generate compression stress (as indicated by arrows in the drawing) due to significant difference in CTE, which causes warpage to the substrate 92P. This compression stress accordingly produces tension stress applied on the chip 90P as indicated by arrows in the drawing of FIG. 11C, making the chip 90P easily crack and fabrication quality undesirably degraded.

SUMMARY OF THE INVENTION

A primary objective of the present invention is to provide a semiconductor package with a crack-preventing member, which can prevent the occurrence of chip cracking in a molding process.

Another objective of the invention is to provide a semiconductor package with a crack-preventing member, which can be cost-effectively fabricated by using simplified processes.

A further objective of the invention is to provide a semiconductor package with a crack-preventing member, which can prevent void formation in a molding process.

In accordance with the above and other objectives, the present invention proposes a semiconductor package with a crack-preventing member, comprising: a chip carrier; at least a chip mounted on the chip carrier and electrically connected to the chip carrier; at least a crack-preventing member formed at a predetermined position on the chip, for generating compression stress on the chip to counteract tension stress produced from the chip carrier on the chip in a molding process, so as to prevent the chip from cracking; and an encapsulant for encapsulating the chip and the crack-preventing member.

The crack-preventing member is not particularly limited in its shape, but it needs to generate the compression stress that can sufficiently counteract the tension stress produced from the chip carrier, so as to prevent the occurrence of chip cracking. The crack-preventing member is dimensionally designed not to be exposed to outside of the encapsulant and not to undesirably affect the overall thickness of the semiconductor package, wherein the crack-preventing member is preferably made of thermal contractible resin such as epoxy resin, and dimensioned to be one third or more in thickness of the chip, and more preferably in half thickness of the chip.

BRIEF DESCRIPTION OF TIE DRAWINGS

The present invention can be more fully understood by reading the following detailed description of the preferred embodiments, with reference made to the accompanying drawings, wherein:

FIG. 1 is a top view of a semiconductor package of a first preferred embodiment of the invention;

FIG. 2 is a cross-sectional view of FIG. 1 cutting along a line 2—2;

FIG. 3 is a bottom view of a semiconductor package of a second preferred embodiment of the invention;

FIG. 4 is a cross-sectional view of FIG. 3 cutting along a line 4—4;

Figure 9:
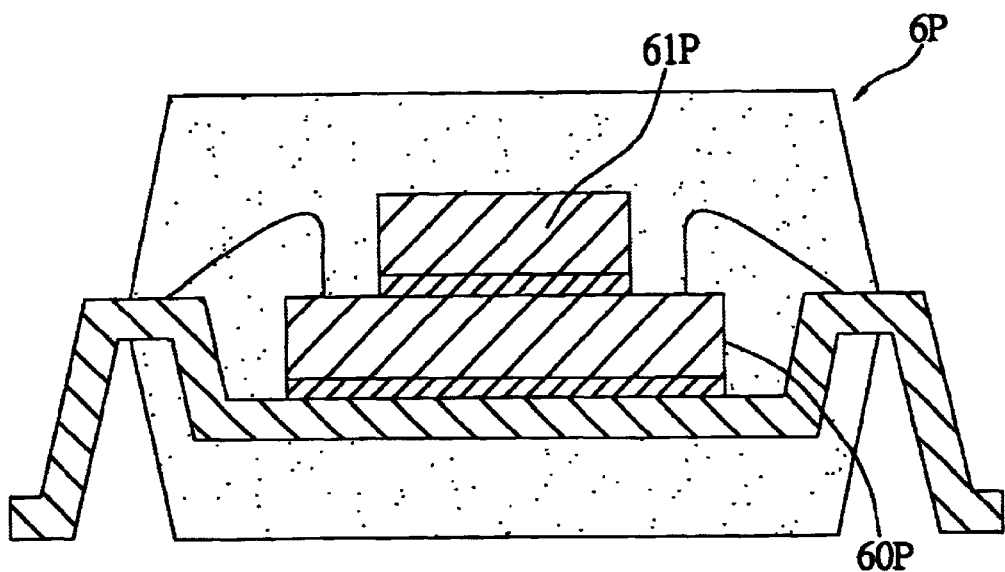
FIG. 9 (PRIOR ART) is a cross-sectional view of another conventional semiconductor package.
Figure 10A:
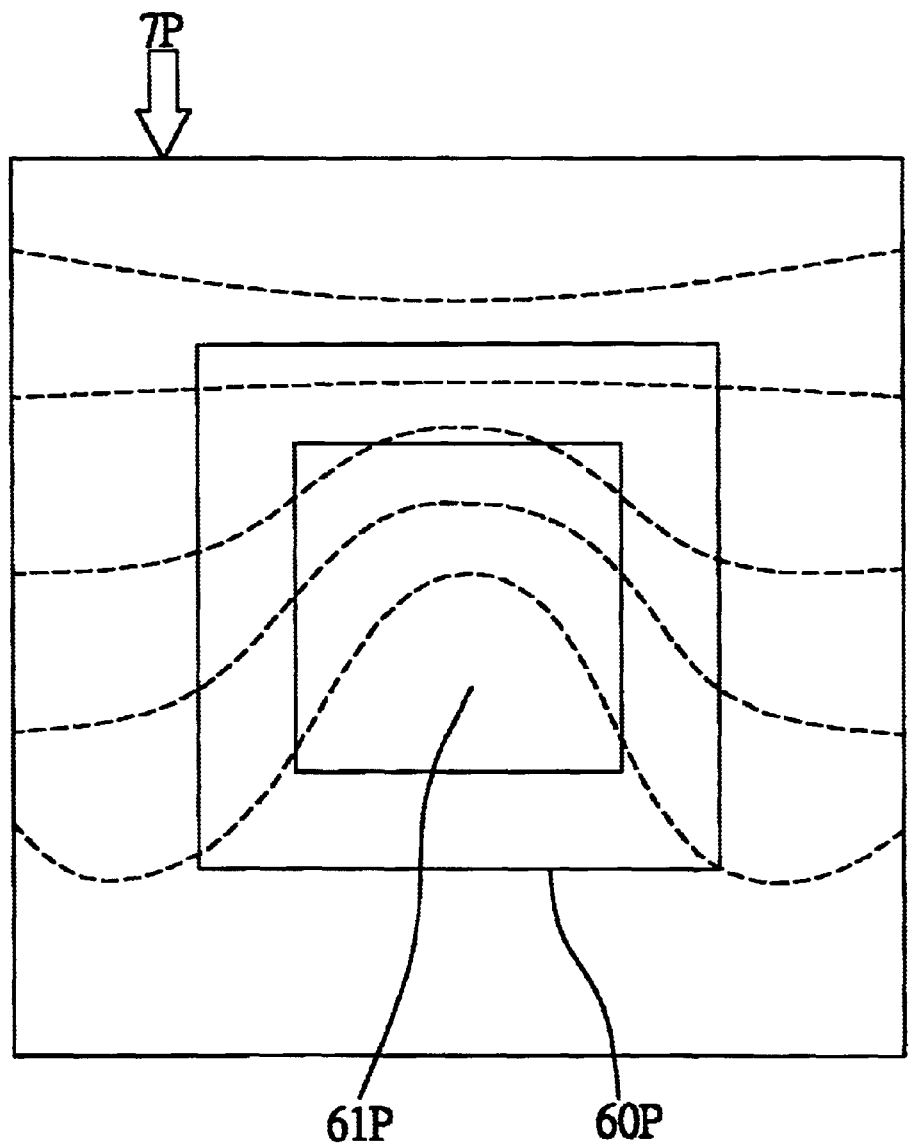
Figure 10C:
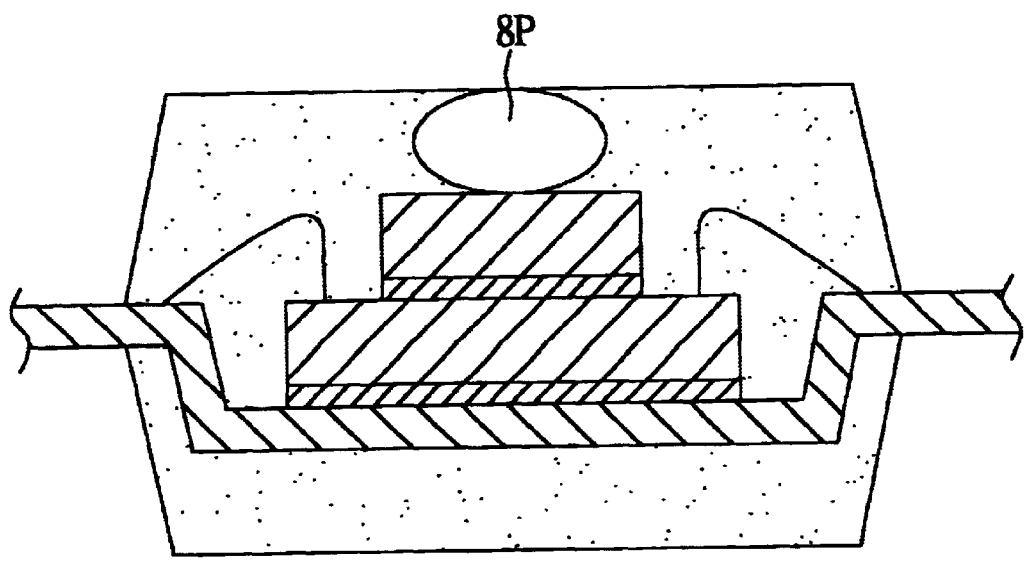
Figure 11A:
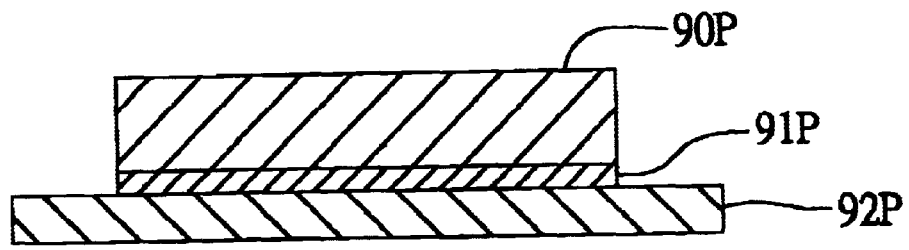
Figure 11B:
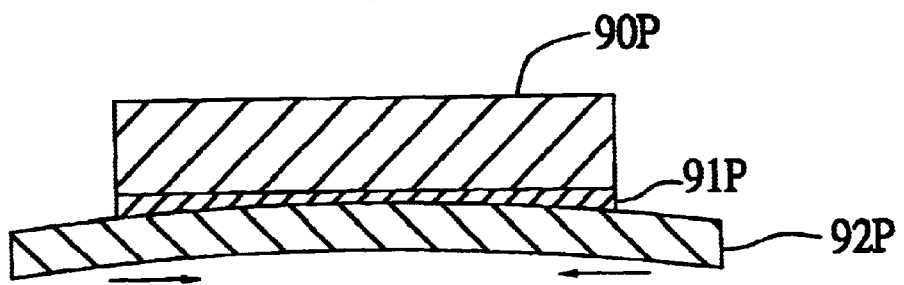
Figure 11C:
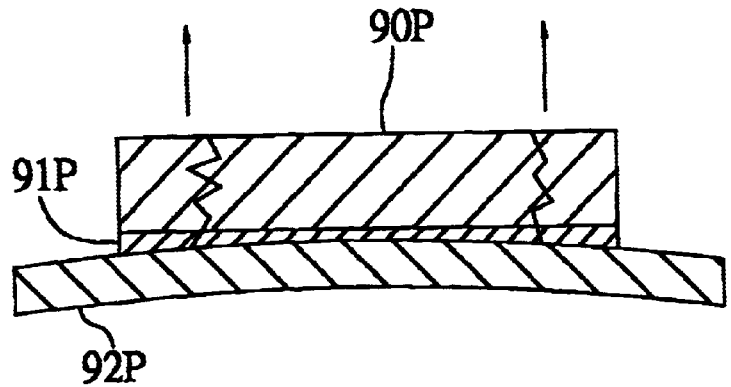

FIG. 10A (PRIOR ART) is a schematic diagram illustrating a conventional semiconductor package of FIG. 9 in a molding process; FIG. 10B (PRIOR ART) is a schematic diagram illustrating an encapsulating resin that entirely encapsulates a chip of FIG. 10A; and FIG. 10C (PRIOR ART) is a cross-sectional view of FIG. 10B cutting along a line 10C—10C; and FIGS. 11A–11C (PRIOR ART) are cross-sectional views respectively illustrating the attachment of a chip to a substrate, substrate warpage, and chip cracking in a conventional semiconductor package.

DETAILED DESCRIPTION OF THE PREFERRED EMBODIMENT

First Preferred Embodiment

FIGS. 1 and 2 are respectively a top view and a cross-sectional view of a semiconductor package of a first preferred embodiment of the invention.

As shown in the drawings, the semiconductor package 1 of the first embodiment of the invention is composed of a substrate 10, a chip 12 attached to the substrate 10 by means of silver paste 11, a plurality of gold wires 13 for electrically connecting the substrate 10 and the chip 12, an encapsulant 14 for encapsulating the chip 12 and the gold wires 13; and a plurality of solder balls 15 implanted on a bottom of the substrate 10 so as to electrically connect the chip 12 to an external device (not shown). It is understood that, since the substrate 10, silver paste 11, chip 12, gold wires 13, encapsulant 14 and solder balls 15 are made of conventional materials and arranged in a conventional manner, they are not further described herein.

The first embodiment of the invention is characterized with the use of a crack-preventing member 16 that is formed at a predetermined position on a top surface of the chip 12 and extends along a central line of the chip 12. The crack-preventing member 16 is made of epoxy resin by utilizing a conventional dispensing or printing technique, and formed as a dam structure on the chip 12. In a temperature cycle of a molding process, tension stress applied on the chip 12 from the substrate 10 and silver paste 11 due to difference in coefficient of thermal expansion, can be counteracted by compression stress produced on the chip 12 from the crack-preventing member 16 since epoxy resin for making the crack-preventing member 16 is thermally contractible. Moreover, unlike the complex and cost-ineffective procedure for adhering the dummy chip as disclosed in U.S. Pat. No. 5,901,043, the crack-preventing member 16 formed on the chip 12 of the invention can be cost-effectively and simply accomplished.

The crack-preventing member 16 is not particularly limited in its dimensions, but it needs to generate compression stress that is applied on the chip 12 and sufficiently counteracts the tension stress produced from the substrate 10 and silver paste 11 to the chip 12. In concern of effectiveness, the thickness of the crack-preventing member 16 is preferably made to be one third or more in thickness of the chip 12, and more preferably about in half thickness of the chip 12.

Second Preferred Embodiment

FIGS. 3 and 4 respectively illustrate a bottom view and a cross-sectional view of a semiconductor package of a second preferred embodiment of the invention.

As shown in the drawings, the semiconductor package of the second embodiment of the invention is structurally similar to that of the first embodiment, with the only difference in employing a lead frame 30 with no die pad as a chip carrier for accommodating a chip 32 in the semiconductor package 3. With no provision of a die pad in the lead frame 30, the chip 32 is directly adhered onto leads 30a of the lead frame 30 by means of a tape 31. This reduces contact area between the chip 32 and the lead frame 30, and thus the lead frame 30 and tape 31 would generate relatively smaller tension stress to the chip 32.

The semiconductor package 3 is a LOC type package, in which gold wires 33 for electrically connecting a top surface of the chip 32 to the leads 30a pass through a gap formed between ends of opposite leads 30a, and a crack-preventing member 36 is formed on a bottom surface of the chip 32. Since the bottom surface of the chip 32 is not bonded with gold wires 33, it provides more area for accommodating the crack-preventing member 36 thereon. Thereby, in this second embodiment of the invention, the crack-preventing member 36 is formed as a pair of strip-like dam structures that are properly spaced apart from each other. Such designed crack-preventing member 36 can more evenly and effectively provide compression stress for counteracting tension stress produced from the lead frame 30 and tape 31 to the chip 32.

Third to Fifth Preferred Embodiments

Figure 5:
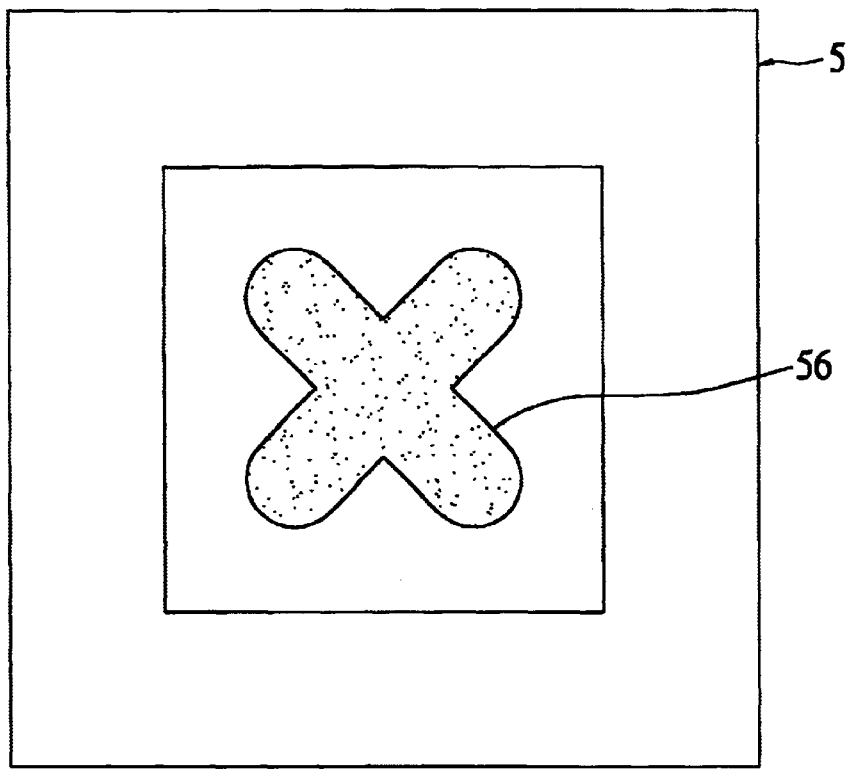
FIG. 5 is a top view of a semiconductor package of a third preferred embodiment of the invention.
Figure 6:
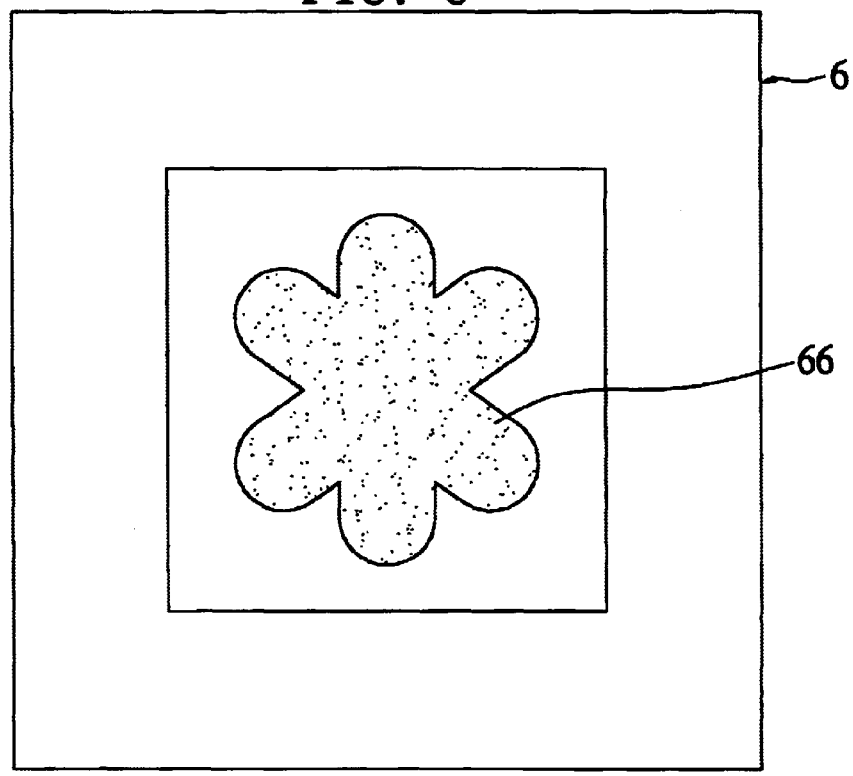
FIG. 6 is a top view of a semiconductor package of a fourth preferred embodiment of the invention.
Figure 7:
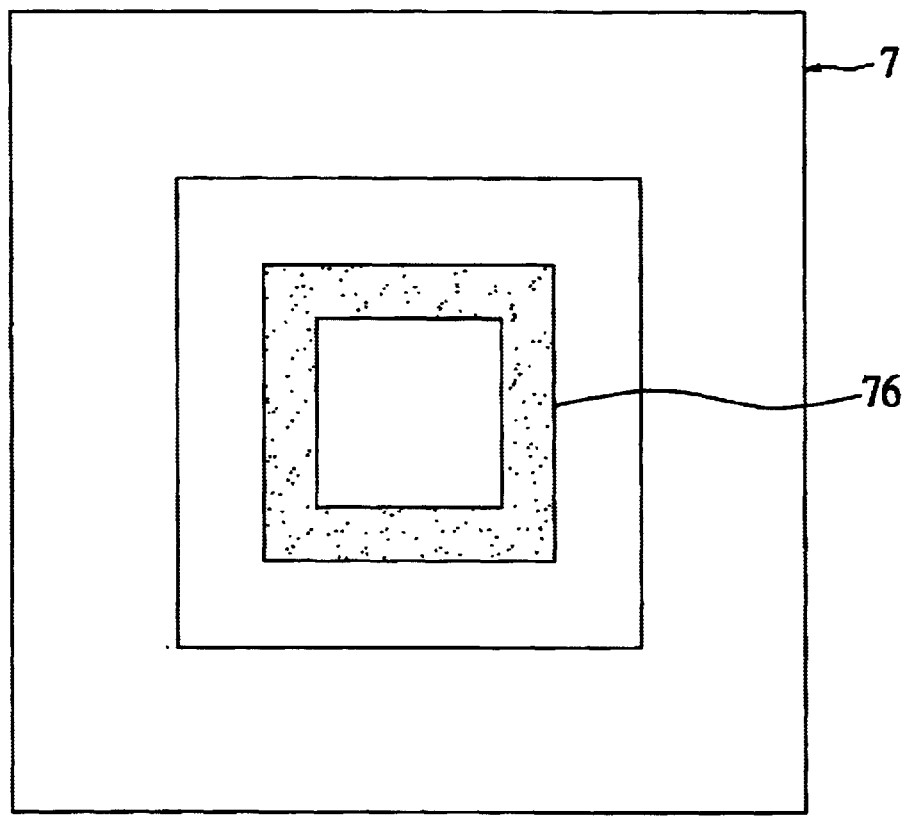
FIG. 7 is a top view of a semiconductor package of a fifth preferred embodiment of the invention.
Figure 8:
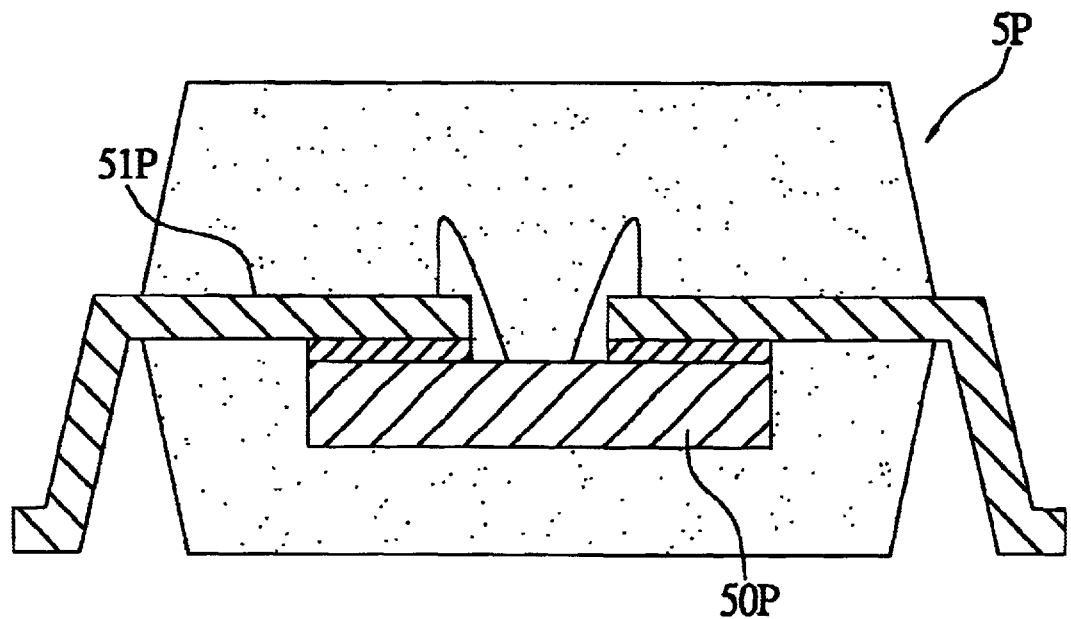
FIG. 8 (PRIOR ART) is a cross-sectional view of a conventional semiconductor package.

FIGS. 5 to 7 respectively illustrate top views of semiconductor packages of third to fifth preferred embodiments of the invention.

The semiconductor packages 5, 6 and 7 of the third to fifth embodiments of the invention are structurally similar to that of the first embodiment. It is not to further describe the structurally similar part herein, but only depict the different part with simplified drawings. A crack-preventing member 56 of the third embodiment is composed of two intercrossed dam structures; a crack-preventing member 66 of the fourth embodiment is formed as three intercrossed dam structures; and a crack-preventing member 76 of the fifth embodiment is made as a rectangular frame structure. These three types of crack-preventing members are used to further reinforce the chip mechanical strength for resisting compression stress.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a crack-preventing member, comprising:

a chip carrier, at least a chip mounted on the chip carrier and electrically connected to the chip carrier;

at least a crack-preventing member formed at a predetermined position on the chip and situated on an opposite side of the chip with respect to the chip carrier, for generating compression stress on the chip to counteract tension stress produced from the chip carrier on the chip in a molding process, so as to prevent the chip from cracking, wherein the crack-preventing member is smaller in surface area than the side of the chip where the crack-preventing member is situated; and an encapsulant for encapsulating the chip and the crack-preventing member.

2. The semiconductor package of claim 1, wherein the crack-preventing member is made of epoxy resin.

3. The semiconductor package of claim 1, wherein the crack-preventing member is dimensioned to be in one-third thickness of the chip.

4. The semiconductor package of claim 1, wherein the crack-preventing member is dimensionally larger than one third in thickness of the chip.

5. The semiconductor package of claim 1, wherein the crack-preventing member is dimensioned to be in half thickness of the chip.

6. The semiconductor package of claim 1, wherein the crack-preventing member is a resin dam structure.

7. The semiconductor package of claim 1, wherein the crack-preventing member is composed of two resin dam structures that are properly spaced apart from each other.

8. The semiconductor package of claim 1, wherein the crack-preventing member is composed of two intercrossed resin dam structures.

9. The semiconductor package of claim 1, wherein the crack-preventing member is composed of three intercrossed resin dam structures.

10. The semiconductor package of claim 1, wherein the crack-preventing member is a rectangular frame structure.

11. The semiconductor package of claim 1, wherein the crack-preventing member and the chip carrier are attached to opposing sides of the chip, respectively.

12. The semiconductor package of claim 1, wherein the chip carrier is a substrate.

13. The semiconductor package of claim 1, wherein the chip carrier is a lead frame.

14. The semiconductor package of claim 1, wherein the crack-preventing member is disposed on a top surface of the chip.

15. The semiconductor package of claim 1, wherein the crack-preventing member is disposed on a bottom surface of the chip.

* * * * *